United States Patent [19]

Giustini

[11] 4,090,127
[45] May 16, 1978

[54] DEVICE FOR MEASURING WITH DIRECT CURRENT THE TOTAL RESISTANCE OF A CIRCUIT WHEN THERE IS ALSO PRESENT AN ALTERNATIVE COMPONENT FROM THE MAINS

[76] Inventor: Augusto Giustini, Via S. Damaso 51, Roma, Italy, 00100

[21] Appl. No.: 725,744

[22] Filed: Sep. 23, 1976

[30] Foreign Application Priority Data

Sep. 30, 1975 Italy .................................. 51585 A/75

[51] Int. Cl.² .............................................. G01R 27/02
[52] U.S. Cl. ................................. 324/62; 324/DIG. 1; 361/42
[58] Field of Search ........................ 324/62, DIG. 1; 323/75 K; 361/15, 16, 42

[56] References Cited

U.S. PATENT DOCUMENTS

| 1,956,538 | 4/1934 | Ridings et al. ..................... 324/62 R |
| 2,883,618 | 4/1959 | Nuut ..................................... 324/62 R |
| 3,001,120 | 9/1961 | Bereskin ............................. 323/75 K |

OTHER PUBLICATIONS

Stout, Basic Electrical Measurements, Jan. 1955, pp. 64, 65.
Dep't. of the Army Technical Manual, TM 11-669, Transients and Waveforms, Nov. 1951, pp. 13-15.

*Primary Examiner*—Stanley T. Krawczewicz
*Attorney, Agent, or Firm*—Beveridge, DeGrandi, Kline & Lunsford

[57] ABSTRACT

Instrument for measuring the total resistance of the protection circuit, that is to say of the phase-to-earth circuit the electric shock may possibly pass through. The modification made in Wheatstone's bridge (two condenser placed between the couples of vertices) allows a side of the bridge to be replaced through a circuit containing electromotive force. However, the alternate voltages involved do influence neither the direct ones utilized for measuring the unknown earth resistance nor the zero-instrument. Feeding is carried out through a Graetz bridge, to which a suitable resistance was added to avoid short-circuits on a side of the same bridge.

2 Claims, 1 Drawing Figure

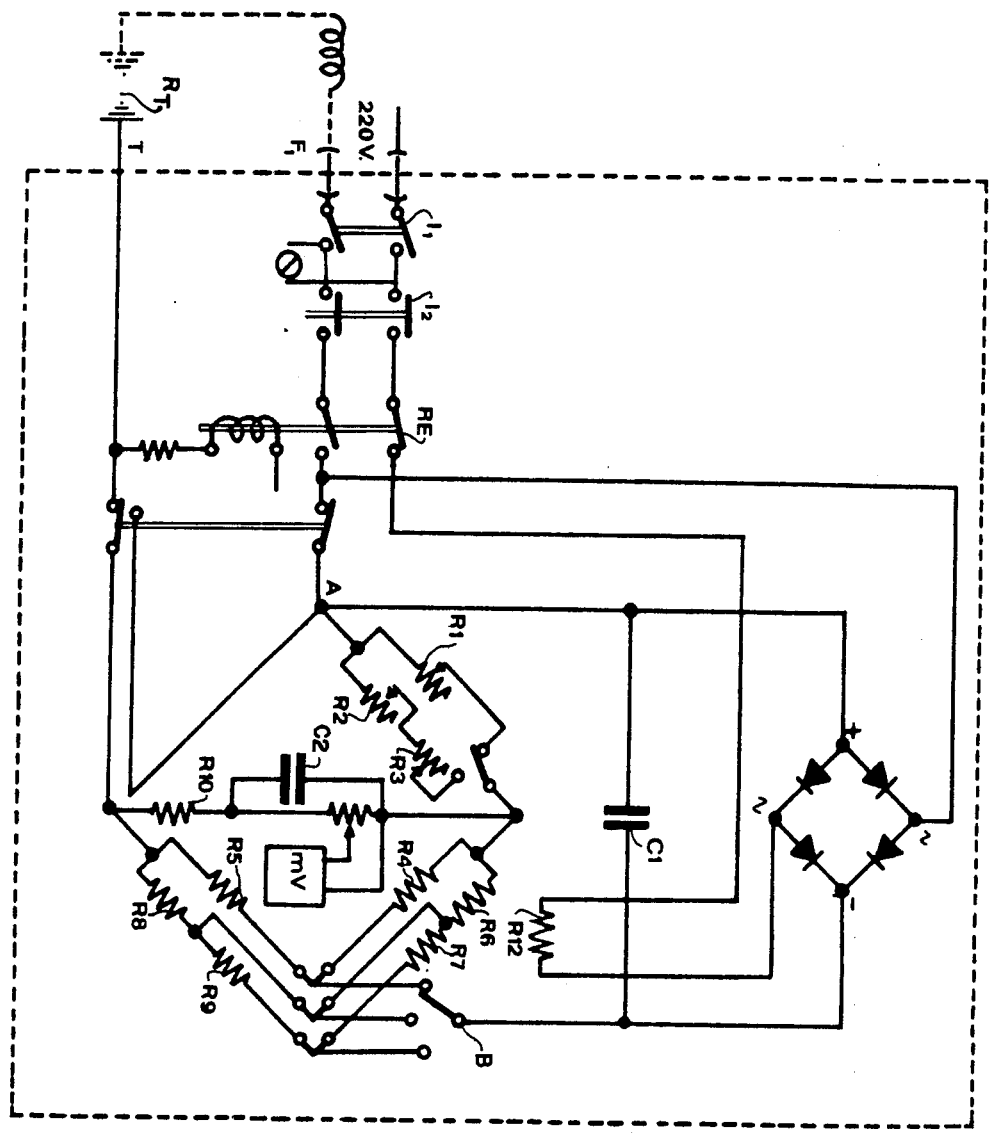

DEVICE FOR MEASURING WITH DIRECT CURRENT THE TOTAL RESISTANCE OF A CIRCUIT WHEN THERE IS ALSO PRESENT AN ALTERNATIVE COMPONENT FROM THE MAINS

This measuring device is composed of a Wheatstone's bridge, and is therefore supplied with direct current, modified through the addition of two condensers located in the position shown in the wiring diagram: this modification makes it possible to replace one of the branches of the bridge — which is usually composed of a single resistor — with another and more complex circuit whose total resistance we wish to measure: said circuit can be the seat of an emf produced by the secondary winding of a transformer, such as might be the case of phase-ground of the low-voltage networks.

So far none of the systems realized for this purpose did produce entirely satisfactory results, either because they used as the measuring current an alternating current in a circuit where there are present, besides the resistance to be measured, also inductances (let us think of the transformer) or unknown capacitances.

The problem therefore can be solved through the use of direct current as the measuring current in a circuit of the phase conductor, ground of transformer's center tap, ground conductor and related ground connection.

A non restricting example of the invention is represented in the adjoined drawing: the condenser C1 (which has a great capacitance and power) fills the purpose of allowing the transit of alternating current coming from the mains' network voltage without disturbing the source of direct current: even more, the presence of the condenser C1 will be useful for the generator, since it will absorb the alternating current components eventually present in the direct current.

The function of the condenser C2 is that of allowing the transit of the alternating current through the diagonal of the bridge without disturbing the instrument indicating the null value of the direct current present in the diagonal and which, as is well know, is reached when the direct currents are in equilibrium with each other.

Consequently the system of alternating currents, even if it is present in the bridge and superimposes itself to the system of direct currents, will create no disturbances.

The phase-ground circuit whose overall resistance is to be measured will then be the seat of a direct current which serves to the measurement and of an alternating current, which will not serve to this purpose but which, nevertheless, fills a very useful purpose, that of preventing the polarization of electrolytic solutions present in the ground resistance: this polarization must instead be reckoned with when the measurements are effected with direct current alone.

The source of direct current can be a battery or another similar device: if the generator is a Graetz's bridge supplied by the same alternating current as that of the mains' network, there will be the necessity of introducing the resistor R12 shown in the electric diagram to avoid short-circuit currents.

The electric diagram uses a millivoltmeter as indicator of null current: additionally it shows that the bridge can be equipped with several resistors in the same branch, to make the tests with different measuring currents.

The working principle of the electric diagram as shown in the drawing is the following: after the manual switching "on" of the main switch I1 and the subsequent switching "on" of the safety switch, the relay RE will be automatically activated only if the overall ground resistance to be measured is sufficiently low: in this case the Graetz's bridge will receive alternating current from the main's network (through the ballast resistor R12, which prevents short circuits between the two polarities under tension) and will in turn generate the direct current which will feed the measuring bridge at the two points A and B.

The resistors from R1 to R9 serve to realize the Wheatstone's bridge with three different measuring currents (determined respectively by R5, R8 and R8+R9).

The value of the unknown resistance $R_T$ can be read on the potentiometer R1 (or R2 + R3) once the bridge has been equilibrated (null tension on the millivoltmeter mV or null current on a microamperometer placed across the diagonals of the bridge).

The mains' network voltage, whose greater fraction passes through C1 and R5 (or R8, R9) and the lesser passes through R1, C2, R10, has no influence whatever on the balance conditions of the bridge, since the fall of voltage in C1 and C2 is negligible.

The safety switch I2 and the relay RE which serves it have the function of preventing the passage of contact tensions which might be dangerous for the ground conductor.

The switch I2 has an auxiliary contact, that is a contact which will remain closed only for a fraction of a second during the closing operation of the same switch: if the current which passes through such contact is sufficiently high — a thing that can happen only if the $R_T$ to be measured is sufficiently low — the coil of the relay will be energized and the relay will be activated and will remain so through an auxiliary contact for self feeding.

The resistor R1 serves to adjust the safety relay.

The alternating current due to the voltage of the mains' network not only will not disturb the direct current system of the measuring bridge, but rather it will perform the function of preventing the polarization of electrolytes eventually present in the ground resistance, a polarization which is liable to occur in the presence of direct current alone.

I claim:

1. An instrument for measuring the total resistance of a circuit comprising:
    a Wheatstone bridge circuit having the circuit whose resistance is to be measured connected as one leg thereof;
    a resistor having a first terminal and a second terminal;
    a bridge rectifier circuit having a first pair of diagonally opposite junctions, one of which is connected to said resistor first terminal, the other of said first pair of diagonally opposite junctions and said resistor second terminal adapted for connection across an alternating voltage source to be supplied with alternating voltage therefrom, said bridge rectifier circuit further having a second pair of diagonally opposite junctions connected across two diagonally opposite junctions of said Wheatstone bridge circuit to supply rectified voltage thereto, whereby said Wheatstone bridge circuit is energized;
    a first capacitor coupled across said two diagonally opposite junctions of said Wheatstone bridge circuit; and a second capacitor coupled across the null indicating device of said wheatstone bridge circuit.

2. An instrument as claimed in claim 1 further comprising an alternating voltage source coupled across said other of said bridge rectifier circuit first pair of diagonally opposite junctions and said resistor second terminal and having the alternating voltage source ground return resistance connected as said one leg of said Wheatstone bridge circuit for measurement of said ground return resistance.

* * * * *